United States Patent [19]

Grossa

[11] Patent Number: 4,904,555

[45] Date of Patent: Feb. 27, 1990

[54] PHOTOSENSITIVE COMPOSITION FOR MAKING REPEATABLY TONABLE LAYERS

[75] Inventor: Mario Grossa, Dreieich, Fed. Rep. of Germany

[73] Assignee: E. I. Du Pont de Nemours and Company, Wilmington, Del.

[21] Appl. No.: 132,477

[22] Filed: Dec. 14, 1987

[30] Foreign Application Priority Data

Dec. 16, 1986 [DE] Fed. Rep. of Germany ....... 3642855

[51] Int. Cl.$^4$ .......................... G03C 1/68; G03C 5/00
[52] U.S. Cl. ....................................... 430/25; 430/28; 430/282; 430/291; 430/920
[58] Field of Search .................. 430/291, 27, 28, 394, 430/281, 282, 920, 25

[56] References Cited

U.S. PATENT DOCUMENTS

| | | | |
|---|---|---|---|
| 4,263,385 | 4/1981 | Pampalone | 430/25 |
| 4,604,340 | 8/1986 | Grossa | 430/270 |
| 4,698,293 | 10/1987 | Grossa | 430/291 |
| 4,716,095 | 12/1987 | Grossa | 430/291 |

Primary Examiner—Jose G. Dees

[57] ABSTRACT

Photosensitive composition for production of repeatably tonable layers for the manufacture of fluorescent screens with a black matrix for color picture tubes, said composition comprising at least one light sensitive 4-(2'-nitrophenyl)-1,4-dihydropyridine compound and at least one organic sulfonic acid.

14 Claims, No Drawings

PHOTOSENSITIVE COMPOSITION FOR MAKING REPEATABLY TONABLE LAYERS

FIELD OF THE INVENTION

The invention involves a photosensitive composition useful for producing repeatedly tonable layers for the manufacture of fluorescent screens with a black matrix for color picture tubes and a process for the production of these screens.

BACKGROUND OF THE INVENTION

Reproduction processes are known in which differences in the tackiness of exposed and unexposed areas of a light sensitive layer are used for image production. The images are made visible by application of a suitable toning material, which adheres only in the tacky areas and can be removed from the nontacky areas. Certain of such imaging materials have a special significance in that multiple, successive exposure and toning steps can be performed with the use of different toners on the same light sensitive layer. Such repeatably tonable photosensitive materials are known and are used commercially for producing multicolor images, for running color proof processes, for preparing color filter masks and electronic circuits as well as for the production of fluorescent screens for color picture tubes.

Especially useful imaging materials for the foregoing purposes have been shown to be those containing a 4-(2'-nitrophenyl)-1,4-dihydropyridine compound. Such a material is disclosed in German Pat. No. 3,429,615 (U.S. Pat. No. 4,604,340). This imaging material can also be used for the fluorescent screens of color picture tubes, which have a black matrix in addition to the dots or lines in the fluorescent pattern, that is, in which the interstices among the light emitting sites are filled or coated with a light absorbing material. The black matrix improves the contrast of the image screen and reduces the reflection of ambient light. However, the production of a black matrix, that is, the application of a fourth color on the fluorescent screen, is technically demanding and causes considerable extra expense.

In the currently known processes, the black matrix is produced either in a first process step or as an adjunct to the preparation of the colored image elements. In the latter case, for example, according to statements in U.S. Pat. No. 4,263,385, a light sensitive negatively tonable material is overall exposed after the production of the fluorescent material pattern, to make the remaining areas tacky and is then toned with a black pigment powder.

A major disadvantage of this method is that the diameter of the fluorescent material dots or the width of the fluorescent material lines must be smaller than the openings of the shadow mask. To achieve this, the corresponding image areas are underexposed, so that it is difficult to attain an adequate toned density and therefore, the image reproduction brightness required in the industry. There is also a disadvantage in that the image elements consisting of comparatively large particles of fluorescent material are contaminated by finely divided particles of the black toner. This also leads to a loss of brightness in image reproduction. Furthermore, the accuracy of the image is affected adversely by the thrice repeated insertion of the shadow mask.

These disadvantages can be avoided if the black matrix material is applied prior to the production of the fluorescent pattern. However, this type of process requires the use of two light sensitive layers. For example, German Pat. No. 3,540,796 (U.S. Pat. No. 4,698,293) discloses a process in which the black matrix is produced on a first negative-working light sensitive layer by image reversal. Then a second negative-working light sensitive layer must be applied on this layer to make the fluorescent material mask.

Another process has been developed in which the matrix pattern can be exposed first with offset lamp positions and then toned. Aside from this process being useful only for the production of fluorescent screens with line image pattern, both methods require complicated, additional process steps.

The problem to which the present invention is directed is that of providing a photosensitive composition for the production of repeatedly tonable layers in the manufacture of fluorescent screens with a black matrix for color picture tubes, which composition makes it possible to produce on a single light sensitive layer first the black matrix and then the fluorescent material pattern for all types of screens.

BRIEF SUMMARY OF THE INVENTION

The present invention relates to photosensitive compositions for the production of repeatedly tonable layers for the manufacture of fluorescent screens with a black matrix for color picture tubes, said composition comprising at least one 1,4-dihydropyridine compound substituted in the 4 position with a 2'-nitrophenyl ring, the improvement wherein the composition also comprises at least one organic sulfonic acid. It also relates to processes whereby a layer of such composition can be used to produce fluorescent screens with a black matrix for color picture tubes.

DETAILED DISCLOSURE OF THE INVENTION

By use of the above photosensitive mixtures, layers can be produced on which a positive image can be produced first, followed by multiple negative images.

The invention is based on the realization that organic sulfonic acids cause tackiness in unexposed light sensitive layers containing at least one 4-(2'-nitrophenyl)-1,4-dihydropyridine compound, yet eliminate the tackiness of the partially exposed areas, so that these partially exposed areas can be exposed imagewise again and be made tacky again.

Suitable organic sulfonic acids for the production of the light sensitive mixture are known to the expert. Especially good results have been obtained with sulfonic acids corresponding to one of the following formulas:

(a) 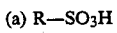 R—SO₃H (b)  HO₃S—R—SO₃H, where R is a saturated or unsaturated hydrocarbon radical with 2–12 carbon atoms or an aryl radical, and the radicals can be substituted with alkyl groups with 1–4 carbon atoms, oxalkyl groups, hydroxyl groups or carboxyl groups.

In addition, good results have been obtained with polymeric sulfonic acids such as polystyrene sulfonic acid with a molecular weight >100,000, sulfonated copolymers of styrene with maleic acid anhydride and isobutylene, or sulfonated copolymers of vinyl toluene with acrylic acid esters.

Sulfonic acids of low volatility such as 5-sulfosalicylic acid and o-toluene sulfonic acid have proven to be especially suitable.

The organic sulfonic acids can be used alone or in combination with each other.

For the production of the light sensitive layer, at least one 4-(2'-nitrophenyl)-1,4-dihydropyridine compound and at least one organic sulfonic acid are dissolved in an organic solvent. The resulting solution is applied by known methods to the fluorescent screen so that a non-crystalline film 0.8–2 μm thick forms. The formation of a non-crystalline film can be achieved, for example, by the use of mixtures of light sensitive compounds, by melting and rapid cooling of the light sensitive compounds, or by dissolving the compounds in highly volatile solvents with high solvent capability. Suitable solvents are methyl ethyl ketone, acetone or methylene chloride.

The choice of light sensitive compounds and organic sulfonic acids must be such that the light sensitive composition is tacky at the temperature of toner application. In general, the layers contain 1 equivalent of acid for 2 to 6 equivalents of light sensitive compound.

Making the unexposed material tacky is possible in various ways and does not pose any difficulty for the expert.

If, for example, a light sensitive compound or a mixture of these compounds with a low glass transition temperature is used, it is advantageous to use an organic sulfonic acid with a higher melting point and a correspondingly higher glass transition temperature. If, on the other hand, the light sensitive compound or the light sensitive mixture has a higher glass transition temperature, an organic sulfonic acid with a lower melting point is used.

Obviously, it is also possible that the original tackiness of the light sensitive mixture be effected by the addition of plasticizers, in which case it is desirable to use plasticizers that are neither photoactive nor strongly acidic. Suitable examples for this purpose are dioctyl phthalate, tricresyl phosphate, polyoxyethylene lauryl ether, triethylene glycol diacetate or hexanoic and octanoic acid esters of triethylene glycol.

Suitable 1,4-dihydropyridine compounds substituted in the 4 position with a 2'-nitrophenyl ring correspond to the following general formula:

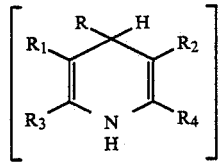

where

R is 2'-nitrophenyl, in which the phenyl radical can be substituted with alkyl, oxalkyl, hydroxyl or halogen groups, $R_1$ and/or $R_2$ can be CN, COOR' or COR', where R' is an alkyl group with 1–11 carbon atoms, which can also be substituted with $OCH_3$ or $O-C_2H_5$ and in which $R_1$ and $R_2$ can be the same or different, $R_3$ and $R_4$ are alkyl, in which $R_3$ and $R_4$ can be the same or different, and $R_1$ and $R_3$ and/or $R_2$ and $R_4$ are the atoms necessary to complete a 5 or 6 membered carbocyclic or heterocyclic ring containing a carbonyl group.

The following compounds have proven to be especially suitable: dimethyl ester of 2,6-dimethyl-4-(2'-nitrophenyl)-1,4-dihydropyridine-3,5-dicarboxylic acid; diethyl ester of 2,6-dimethyl-4-(2'-nitrophenyl)-1,4-dihydropyridine-3,5-dicarboxylic acid; diethyl ester of 2,6-dimethyl-4-(2'-nitro-4',5'-dimethoxyphenyl)-1,4-dihydropyridine-3,5-dicarboxylic acid; di-n-propyl ester of 2,6-dimethyl-4-(2'-nitrophenyl)-1,4-dihydropyridine-3,5-dicarboxylic acid; diisopropyl ester of 2,6-dimethyl-4-(2'-nitrophenyl)-1,4-dihydropyridine-3,5-dicarboxylic acid; diisopropyl ester of 2,6-dimethyl-4-(2'-nitrophenyl)-1,4-dihydropyridine-3,5-dicarboxylic acid; di($\beta$-ethoxyethyl)ester of 2,6-dimethyl-4-(2'-nitrophenyl-1,4-dihydropyridine-3,5-dicarboxylic acid; 3-methyl-5-ethyl ester of 2,6-dimethyl-4-(2'-nitrophenyl)-1,4-dihydropyridine-3,5-dicarboxylic acid; 3-isopropyl-5-methyl-ester of 2,6-dimethyl-4-(2'-nitrophenyl)-1,4-dihydropyridine-3,5-dicarboxylic acid; ethyl ester of 4-(2'-nitrophenyl)-2,6-dimethyl-3-aceto-1,4-dihydropyridine-5-carboxylic acid; 2,6-dimethyl-4-(2'-nitrophenyl)-3,5-di-aceto-1,4-dihydropyridine; and 2,6-dimethyl-4-(2'-nitrophenyl)-3,5-dicyano-1,4-dihydropyridine.

The light sensitive compounds can be used alone, in combination with one another, or with a binder. Although it is preferred to use a composition consisting essentially of mixtures of 1,4-dihydropyridine compounds, the light sensitive material can also be used with binders. The concentration of the light sensitive material in the binder can vary within wide limits and lies in the range of 0.2 to 9 parts by weight for one part by weight of the binder.

Suitable binders are polyacrylic acid or methacrylic acid esters as well as copolymers with acrylic or methacrylic acid or other acrylic or vinyl monomers, copolymers of maleic acid anhydrides, of maleic acid or its diesters or half esters with styrene or other vinyl monomers, chlorine containing vinyl polymers or copolymers such as polyvinyl chloride as well as its post-chlorinated products, polyvinylidene chloride, chlorinated polyethylene, etc., polystyrene and polystyrene copolymers, ethylene and ethylene copolymers, for example, with maleic acid, etc., types of synthetic rubber on the basis of butadiene, chloroprene etc. and their copolymers, for example, with styrene, acrylonitrile, etc, polyethers such as high molecular weight polyethylene oxide or polyepichlorohydrin, etc.

The mixtures can optionally contain other additives, such as, for example, wetting agents, stabilizers, optical brighteners, matte agents and others.

As the light sensitive layer has its maximum sensitivity in the ultraviolet range between 300 and 400 nm, the radiation sources used are those that deliver an effective quantity of these rays, such as, for example, mercury vapor lamps, xenon lamps or fluorescent lamps. The exposure of a fluorescent screen provided with a light sensitive layer is conducted on a television exposure table, as is customary for this purpose, provided with a mercury vapor lamp and through a corresponding shadow mask. As the sensitivity of the light sensitive layers is a function of the toning temperature and of the composition of the toner, it is advantageous to determine the optimum exposure time in the usual manner with the use of a step wedge.

After exposure, the fluorescent material pattern is produced by applying fluorescent material powder to the exposed areas as is customary for this purpose, such as, for example, zinc sulfide or rare earth oxysulfides, which can be optionally doped with another metal.

For the production of the black matrix, iron oxide or graphite powder in pure form or on a powdered carrier are preferred.

The powdered toner can be applied to the fluorescent screen, for example, by adding an excess of toner into the tub-shaped screen and shaking the structure appropriately. Thus the powder is distributed over the screen and adheres to the tacky areas. The excess is removed by the use of air pressure.

For the production of a fluorescent screen with a black matrix, a thin, light sensitive layer according to the invention is applied to the inner surface of a fluorescent screen by spin coating and dried. The layer is exposed on the usual television exposure table through a line or dot shadow mask successively in the three positions of green, blue and red. After the mask is removed, the unexposed tacky areas are toned with a finely divided black pigment. The mask is applied again and the layer is exposed again in a first position. The exposed tacky line or dot image elements are then toned with blue, green or red fluorescent powder.

After a subsequent second, shifted exposure, the corresponding areas of the light sensitive layer similarly in the form of line or dot image elements are toned with a second color. By a third shifted exposure, other areas of the light sensitive layer also in the form of line or dot image elements become tacky and are toned with fluorescent powder of the third color. Finally, the light sensitive layer is removed by heating to temperatures between 400° and 450° C.

In one especially advantageous embodiment, an acid treatment, as described in German Pat. No. 35 40 804 (U.S. Ser. No. 6/930,102) is conducted after each toning step.

The following examples illustrate the invention.

EXAMPLES

Example 1

A solution of 2.7 g of dimethyl ester of 2,6-dimethyl-4-(2'-nitrophenyl)-1,4-dihydropyridine-3,5-dicarboxylic acid and 0.8 g of p-toluene sulfonic acid in 60 ml of methyl ethyl ketone is applied by spin coating on the inner surface of a fluorescent screen so that the thickness of the dried layer is 1.2 $\mu$m. A shadow mask with slits (160 micrometers wide) is placed in position. The screen is exposed on the usual television exposure table with a 1000 watt mercury vapor lamp in the three positions of red, blue and green, successively, for 10 seconds each. After the shadow mask is removed, the tacky remaining areas are toned with a carbon pigment (average grain diameter 3 $\mu$m). Black matrix lines 80 $\mu$m wide are obtained. The mask is applied again and the same layer is exposed for 50 seconds in the green position. The newly tacky areas are toned with a green fluorescent powder. The same exposure process is repeated in the blue and in the red position, and after each exposure the corresponding fluorescent powder is applied.

Fluorescent material lines 130 $\mu$m wide fill the interstices of the matrix. The fluorescent material lines show no contamination by the black pigment.

Example 2

A solution of 3.0 g of di-n-propyl ester of 2,6-dimethyl-4-(2'-nitrophenyl)-1,4-dihydropyridine-3,5-dicarboxylic acid and 0.8 g of 5-sulfosalicylic acid in 60 ml of methyl ethyl ketone is applied by spin coating on the inner surface of a fluorescent screen so that the thickness of the dry layer is 1.4 $\mu$m.

After the application of a dot mask, the screen is exposed on the usual television exposure table with a 2000 watt mercury vapor lamp in the three positions for red, blue and green successively for 30 seconds each. After the dot mask is removed, the tacky remaining areas are toned with a black iron oxide powder (average grain diameter of 3.5 $\mu$m). The result is a black positive image of the mask. The mask is applied again and the same layer is exposed in the green position for 2 minutes. The newly tacky areas are toned with a green fluorescent powder. The same exposure process is repeated in the blue and in the red position, and after each exposure the corresponding fluorescent toning material is applied. The fluorescent material dots fill the free spaces of the matrix.

Example 3

A solution of 3.5 g of dimethyl ester of 2,6-dimethyl-4-(2'-nitrophenyl)-1,4-dihydropyridine-3,5-dicarboxylic acid, 12.0 g of diethyl ester of 2,6-dimethyl-4-(2'-nitrophenyl)-1,4-dihydropyridine-3,5-dicarboxylic acid and 1.2 g of ethane sulfonic acid in 150 ml of methyl ethyl ketone is applied on the inner surface of a fluorescent screen by spin coating so that the thickness of the dry layer is 1.3 $\mu$m.

After a shadow mask with slits (160 $\mu$m wide) is inserted, the screen is exposed on the usual television exposure table with a 1000 watt mercury vapor lamp in the three positions of green, blue and red successively for 15 seconds each. The shadow mask is removed and the tacky remaining areas are toned with graphite powder (4 $\mu$m average grain size). Black lines 90 $\mu$m wide are obtained. The mask is inserted again and the same layer is exposed for 60 seconds in the green position. The newly tacky areas are toned with a green fluorescent powder. After removal of the excess fluorescent powder, the screen is treated, as described in German Pat. No. 35 40 804 (U.S. Ser. No. 6/930,102) with a powdery mixture of 3 parts by weight of amorphous silica that has been activated with 1 part of 20% by weight aqueous hydrochloric acid. The acid treated powder is removed pneumatically. After the shadow mask is inserted again, the exposure step is repeated in the red and in the blue positions, and after each exposure the newly tacky areas are toned with the corresponding fluorescent powder. Before each such exposure, the application of acid-treated powder is similarly repeated. Fluorescent material lines 120 $\mu$m wide fill the interstices of the matrix.

Example 4

A Solution A of 2.7 g of dimethyl ester of 2,6-dimethyl-4-(2'-nitrophenyl)-1,4-dihydropyridine-3,5-dicarboxylic acid, and 0.8 g of p-toluene sulfonic acid;

and a Solution B of 2.7 g of dimethyl ester of 2,6-dimethyl-4-(2'-nitrophenyl)-1,4-dihydropyridine-3,5-dicarboxylic acid, and 0.48 g of sulfuric acid (96% by volume);

each in 60 ml of methyl ethyl ketone, are coated on two glass plates so that the layer thicknesses are 0.9 $\mu$m after drying. Each sample is exposed with a 1000 watt mercury vapor lamp at a distance of 60 cm for 2 minutes through a step wedge (k=0.1) and then toned with a zinc sulfide fluorescent screen powder.

The results are summarized in Table 1:

TABLE 1

|  | Plate A | Plate B |
| --- | --- | --- |
| Number of steps coated with toner | 0-2 & 6-30 | 0-15 |
| Number of steps not coated with toner | 3-5 | 16-30 |

It is evident from Table 1 that the use of an inorganic acid of comparable strength does not yield partially exposed, non-tonable areas which can be rendered newly tacky by another exposure. In other words, in the presence of such an inorganic acid, the light sensitive layer cannot be toned first in the positive mode and then repeatedly in the negative mode.

I claim:

1. A photosensitive composition for the production of repeatedly tonable layers for the manufacture of fluorescent screens with a black matrix for color picture tubes, said composition comprising at least one 1,4-dihydropyridine compound substituted in the 4 position with a 2'-nitrophenyl ring, the improvement wherein the composition also comprises at least one organic sulfonic acid in an amount such that the photosensitive composition is tacky at the temperature of toner application.

2. A photosensitive composition in accordance with claim 1, wherein the composition comprises 1 equivalent of organic sulfonic acid for 2 to 6 equivalents of 1,4-dihydropyridine compound.

3. A photosensitive composition in accordance with claim 1, wherein the organic sulfonic acid has low volatility.

4. A photosensitive composition in accordance with claim 1, wherein the organic sulfonic acid is a compound of one of the following formulas:

(a) R—SO$_3$H, or (b) HO$_3$S—R—SO$_3$H, where R is an saturated or unsaturated hydrocarbon radical with 2-12 carbon atoms or an aryl radical and the radicals can be substituted with alkyl groups of 1-4 carbon atoms, oxalkyl groups, hydroxyl groups, or carboxyl groups.

5. A photosensitive composition in accordance with claim 2, wherein the organic sulfonic acid is a compound of one of the following formulas:

(a) R—SO$_3$H, or (b) HO$_3$S—R—SO$_3$H, where R is an saturated or unsaturated hydrocarbon radical with 2-12 carbon atoms or an aryl radical and the radicals can be substituted with alkyl groups of 1-4 carbon atoms, oxalkyl groups, hydroxyl groups, or carboxyl groups.

6. A photosensitive composition in accordance with claim 4, wherein the organic sulfonic acid is 5-sulfosalicylic acid and/or p-toluene sulfonic acid.

7. A photosensitive composition in accordance with claim 5, wherein the organic sulfonic acid is 5-sulfosalicylic acid and/or p-toluene sulfonic acid.

8. A process for the production of a fluorescent screen with a black matrix for color television tubes comprising the steps of:
   (1) applying a photosensitive, repeatably tonable layer of a photosensitive composition comprising at least one 1,4-dihydropyridine compound substituted in the 4 position with a 2'-nitrophenyl ring and at least one organic sulfonic acid on the inner surface of the screen,
   (2) exposing the layer successively through a shadow mask in the green, blue and red positions,
   (3) toning the unexposed tacky areas with a black pigment,
   (4) exposing imagewise to produce tacky areas in the green, blue, or red position,
   (5) toning the resulting tacky areas with a fluorescent powder of the corresponding color, and
   (6) repeating the imagewise exposing and toning steps twice, each time in a different color position, and after each exposure, toning with a fluorescent powder of the corresponding second or third color.

9. A process of claim 8, wherein the photosensitive composition comprises 1 equivalent of organic sulfonic acid for 2 to 6 equivalents of 1,4-dihydropyridine compound.

10. A process of claim 8, wherein the organic sulfonic acid has low volatility.

11. A process of claim 8, wherein the organic sulfonic acid is a compound of one of the following formulas:

(a) R—SO$_3$H, or (b) HO$_3$S—R—SO$_3$H, where R is a saturated or unsaturated hydrocarbon radical with 2-12 carbon atoms or an aryl radical and the radicals can be substituted with alkyl groups of 1-4 carbon atoms, oxalkyl groups, hydroxyl groups, or carboxyl groups.

12. A process of claim 9, wherein the organic sulfonic acid is a compound of one of the following formulas:

(a) R—SO$_3$H, or (b) HO$_3$S—R—SO$_3$H, where R is a saturated or unsaturated hydrocarbon radical with 2-12 carbon atoms or an aryl radical and the radicals can be substituted with alkyl groups of 1-4 carbon atoms, oxalkyl groups, hydroxyl groups, or carboxyl groups.

13. A process of claim 11, wherein the organic sulfonic acid is 5-sulfosalicyclic acid and/or p-tolene sulfonic acid.

14. A process of claim 12, wherein the organic sulfonic acid is 5-sulfosalicyclic acid and/or p-toluene sulfonic acid.

* * * * *